United States Patent [19]

Hata et al.

[11] 3,923,522

[45] Dec. 2, 1975

[54] PHOTOSENSITIVE COMPOSITION

[75] Inventors: Yukinori Hata, Tokyo; Hidetoshi Komiya, Chiba; Yuzuru Osabe, Yokohama; Tutomu Watanabe, Tokyo; Hiroyoshi Yamada, Musashino, all of Japan

[73] Assignee: Oji Paper Co., Ltd., Tokyo, Japan

[22] Filed: July 18, 1973

[21] Appl. No.: 380,276

[52] U.S. Cl. .................... 96/115 R; 96/33; 96/35.1; 96/36; 96/36.2; 96/36.3; 96/75; 96/91 N; 96/49

[51] Int. Cl. .......................... G03f 7/08; G03c 1/72

[58] Field of Search ......... 96/91 N, 115 R, 75.8 GP, 96/35.1, 33; 260/349, 668 F

[56] References Cited

UNITED STATES PATENTS

| | | | |
|---|---|---|---|
| 2,063,631 | 12/1936 | Schmidt et al. | 96/91 R |
| 2,695,846 | 11/1954 | Mally | 96/91 N |
| 3,174,860 | 3/1965 | Sus et al. | 96/91 N |
| 3,282,693 | 11/1966 | Sagura et al. | 96/91 N |
| 3,284,198 | 11/1966 | Grotta et al. | 96/91 N |
| 3,285,742 | 11/1966 | Wagner | 96/91 N |
| 3,287,128 | 11/1966 | Lugasch | 96/91 N |
| 3,486,900 | 12/1969 | Tsunoda et al. | 96/91 R |
| 3,494,767 | 2/1970 | Laridon et al. | 96/91 D |
| 3,519,424 | 7/1970 | Reynolds et al. | 96/91 N |
| 3,526,503 | 9/1970 | Dunham et al. | 96/91 D |
| 3,549,373 | 12/1970 | Hamada et al. | 96/91 D |
| 3,679,419 | 7/1972 | Gillich | 96/91 R |

FOREIGN PATENTS OR APPLICATIONS

| | | | |
|---|---|---|---|
| 44-6411 | 3/1969 | Japan | 96/91 N |

OTHER PUBLICATIONS

Kosar, J., "Light-Sensitive Systems," J. Wiley & Sons, 1965, pp. 330–336.

Chem. Abstracts, Vol. 74, 1971, p. 4079h (see subject index 1967–1971 at 264105, first column).

*Primary Examiner*—Charles L. Bowers, Jr.
*Attorney, Agent, or Firm*—Paul & Paul

[57] ABSTRACT

A highly photosensitive composition capable of being developed by an alkaline aqueous solution comprises an alkali-soluble phenolic resin selected from phenol novolak resins, m- and p-cresol, p-tert.-butyl and cashew nut shell oil modified phenol novolak resins, and, if desired, an alkali-soluble vinyl polymer selected from copolymers of acrylic acid with acrylic esters, methacrylic acid with acrylic esters, maleic anhydride with styrene and maleic esters with styrene, and an azidopyrene compound of the formulae (I) or (II).

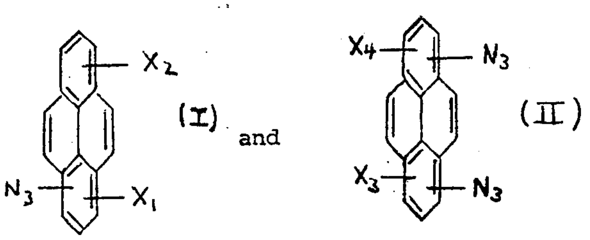

wherein $X_1$, $X_2$, $X_3$ and $X_4$ each represent a hydrogen or halogen atom or nitro, monoalkylamino, acylalkylamino, dialkylamino, tosylamino, alkoxyl, hydroxyl, acyl, carboxyl, carboxymethyl or sulfonic acid radical.

23 Claims, 2 Drawing Figures

PHOTOSENSITIVE COMPOSITION

Figure 1:
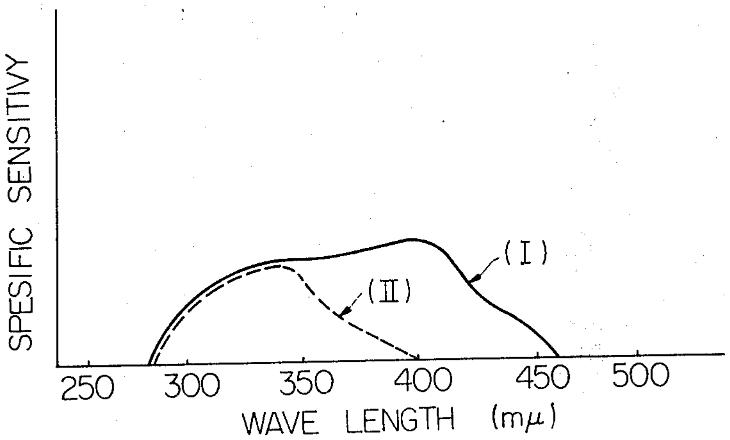

The present invention relates to a novel photosensitive composition, more particularly, relates to a photosensitive composition capable of being developed by an alkaline aqueous solution, which composition contains a highly photosensitive azidopyrene compound.

Broadly speaking, photosensitive resins or compositions capable of photo-hardening or being insolubilizing are widely utilized for productions of offset printing plates, relief printing plates and printed circuit boards. The conventional photosensitive resins such as cinnamic acid ester of polyvinyl alcohol and azidized vinyl polymers and the conventional photosensitive compositions containing a resin such as polyamides, polyacrylamides cyclized rubbers, styrene-butadiene rubber and vinyl polymers and a photosensitive polymerization initiator such as carbonyl compounds, diazo compounds and azide compounds, have the disadvantages that flammable and water-insoluble organic solvents are necessary to develop them.

In order to eliminate the above-stated disadvantages, different types of photosensitive compositions are utilized, which are capable of being developed with an alkaline aqueous solution. Such alkali-soluble photosensitive compositions comprise an alkali-soluble phenol resin and an azide compound of benzophenone, chalcone and dibenzalcyclohexanone. However, the conventional alkali-soluble photosensitive compositions have disadvantages as detailed below.

1. Relatively low photosensitivity of the conventional azide compound.
2. Relatively low hardening rate of the composition.
3. Relatively poor rigidity of the hardened resin.
4. Insufficient receptivity for printing ink.
5. Insufficient resistance to corrosion, of the hardened resin.
6. High tendency to decrease photosensitivity of the composition during storage.
7. Low stability of the photosensitive composition during development.
8. Relatively narrow range of pH 11.5 to 12.5, at which the photosensitive composition is developed.

The object of the present invention is to provide a photosensitive composition capable of being developed with an alkaline aqueous solution, which composition has an excellent photosensitivity and a high hardening rate when exposed to radiation rays.

Another object of the present invention is to provide a photosensitive composition capable of forming sharp and definite resin images having a high rigidity, ink-receptivity and resistance to corrosion.

Still another object of the present invention is to provide a photosensitive composition having excellent stability during storage and development.

And, a further object of the present invention is to provide a photosensitive composition capable of being developed in a relatively wide range of pH and of being exposed in a relatively wide latitude.

The above-stated objects can be accomplished by the photosensitive composition of the present invention which comprises an alkali-soluble phenolic resin and 5 to 30%, based on the weight of the phenolic resin, of at least one photosensitive compound selected from the group consisting of monoazidopyrene compounds of the formula (I) and diaziodpyrene compounds of the formula (II):

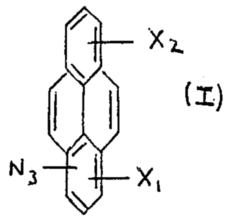

(I) and

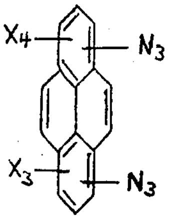

(II)

wherein $X_1$, $X_2$, $X_3$ and $X_4$ each represent a hydrogen or halogen atom or nitro, monoalkylamino, acylalkylamino, dialkylamino, tosylamino, alkoxyl, hydroxyl, acyl, carboxyl, carboxymethyl or sulfonic acid radical.

The photosensitive composition of the present invention may contain at most 100%, based on the weight of the phenolic resin, of an alkali-soluble vinyl polymer material selected from the group consisting of copolymers of acrylic acid with at least one acrylic ester, methacrylic acid with at least one acrylic ester, maleic anhydride with styrene and at least one maleic ester with styrene and mixtures of two or more of the above-mentioned copolymers.

The alkali-soluble phenolic resins usable for the photosensitive composition of the present invention may be selected from the group consisting of phenol novolak resins, modified phenol novalak resins and mixtures of two or more of the above-mentioned resins, which phenolic resins can be dissolved in an alkaline aqueous solution having a pH of 11.5 to 14.0. Such alkaline aqueous solutions include aqueous solutions of sodium hydroxide, potassium hydroxide, sodium carbonate, sodium methasilicate, sodium silicate, trisodium phosphate, and mixtures of two or more of the above-mentioned alkaline compounds.

The phenolic novolak resins usable for the present invention are preferably prepared by condensing phenol and formaldehyde in a mole ratio of 1 : 0.7 to 0.9, preferably, 1 : 0.8. Such phenolic novolak resins preferably have a relatively high degree of condensation, for example 3 to 4.

The modified phenol novolak resins usable for the present invention may be selected from the group consisting of m-cresol, p-cresol, p-tert.-butylphenol and cashew nut shell oil modified phenol novolak resins. Preferably, the modified phenol novolak resins have a melting point of 108° to 113°C, and are prepared by condensing phenol, modifying component and formaldehyde in a mole ratio of 1 : 0.1 – 0.5 : 0.8 – 1.0, preferably 1 : 0.2 : 0.9.

Referring to J. H. Boyer and F. C. Canter, Chemical Reviews, 54 (No. 1), (1954), "Alkyl and Aryl Azides"; C. G. Overberger, J. P. Anselme and J. G. Lombardino, "Chemistry of Organic Compound with Nitrogen-Nitrogen Bonds" published in 1966 by Ronald Press Co., Ltd., New York; and J. Kosar, "Light-Sensitive Systems" published in 1965 by John Wiley and Sons, Inc., New York, it is known that azide compounds are decomposed by action of heat and light to form nitrene radicals. The nitrene radical is effective as an initiator for photo-condensation reaction for phenol novolak or modified phenol novolak resins. As a result of the photo-condensation, the composition of the alkali-soluble phenolic resins and the pyrene compounds can be hardened and insolubilized in the alkaline aqueous solution. This is because the phenolic resin and the pyrene compound are cross-linked so as to form two dimensional or three dimensional networks.

The azido compound available for the present invention is selected from the group consisting of monoazidopyrene compounds of the formula (I) and diazidopyrene compounds of the formula (II):

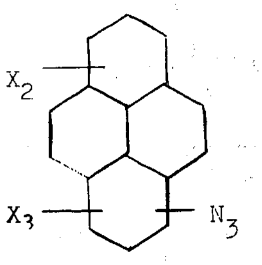

(I)

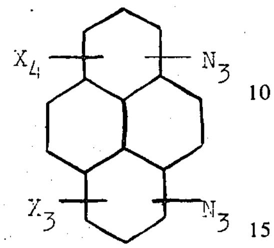

(II)

wherein $X_1$, $X_2$, $X_3$ and $X_4$ each represent a hydrogen or halogen atom or nitro, monoalkylamino, acylalkylamino, dialkylamino, tosylamino, alkoxy, hydroxyl, acyl, carboxyl, carboxymethyl or sulfonic acid radical. In the above-mentioned atoms and radicals, the halogen atom is fluorine, chlorine, bromine or iodine atom, preferably, chlorine or bromine atom; the monoalkylamino radical preferably has an alkyl group having 1 to 4 carbon atoms, for example, methyl ethyl, propyl and butyl groups; the acylalkylamino radical preferably has an acyl group having 2 to 7 carbon atoms, for example, acetyl, propionyl, butylyl, and valeryl and benzoyl groups, and an alkyl group having 1 to 4 carbon atoms; the dialkylamino radical preferably has the same or different two alkyl groups each having 1 to 4 carbon atoms; the alkoxyl radical preferably has 1 – 4 carbon atoms; and the acyl radical preferably has 2 to 7 carbon atoms.

The azidopyrene compound of the formulae (I) and (II) is contained, in an amount of 5 to 30%, preferably, 10 to 20% based on the weight of the alkali-soluble phenolic resin, in the photosensitive composition of the present invention, and acts as a photo-polymerization initiator.

If the content of the azidopyrene compound is less than 5%, the photosensitive composition has a poor hardening property and the hardened composition has an insufficient rigidity and resistance to abrasion. Also, if the content of the azidopyrene compound is more than 30%, it results in an economical disadvantage and the hardened resin has an undesirably high brittleness.

The azidopyrene compounds available for the present invention may be prepared by a conventional method such that an aminopyrene compound corresponding to the desired azidopyrene compound is diazotized and then the diazonium compound is converted to the desired azidopyrene compound.

The azidopyrene compounds of the formula (I) may be 1-azidopyrene, 6-nitro-1-azidopyrene, 1-azido-6-acetylamino-pyrene, 1-azido-8-acetylaminopyrene, 1-azido-6-chloropyrene, 1-azido-6-bromopyrene, 1-azido-3,8-dihydroxypyrene, 1-azido-6-methoxypyrene, 1-azido-6-benzoyl-aminopyrene, 1-azido-6-N-ethylaminopyrene, 1-azidopyrene-3,8-disulfonic acid, 1-azidopyrene-6-carboxylic acid, 1-azido-6-N,N-dimethylaminopyrene, 1-azido-6-p-tosylaminopyrene, 1-azido-6-carboxymethyl-pyrene, 1-acetyl-6-azidopyrene, 1-propionyl-6-azidopyrene, 1-n-butylyl-6-azidopyrene, 1-isobutylyl-6-azidopyrene, 1n-valeryl-6-azidopyrene, 1-isovaleryl-6-azidopyrene, 1-sec.valeryl-6-azidopyrene, acetylazidopyrene sulfonic acid, acetylchloroazidopyrene, acetylbromoazidopyrene, acetylmethylazidopyrene, acetylmethoxyazidopyrene, acetylphenoxyazidopyrene, acetylnitroazidopyrene, acetylaminoazidopyrene, acetyl-N-methylaminoazidopyrene, acetyl-N,N-dimethylazidopyrene, acetylazidopyrene carboxylic acid, propionylazidopyrene sulfonic acid, propionylazidopyrene carboxylic acid, and ethyl ester of propionylazidopyrene carboxylic acid. The diazidocompounds of the formula (II) may be 1,6-diazidopyrene, acetyl-diazidopyrene and propionyl-diazidopyrene.

The azidopyrene compounds usable for the present invention have a high spectral sensitivity in a wave length region which includes relatively large wave lengths at which the conventional azide compounds such as azidobenzene, azidonaphthalene and azidoanthracene compounds hhave a low spectral sensitivity. Further, the azidopyrene compounds have a photo-hardening property much higher than that of the conventional azidocompounds, for example, 2,5-di(4'-azido-benzal)-cyclohexanone, 4,4'-diazidostilbene, 4,4'-diazidochalcone.

Figure 2:
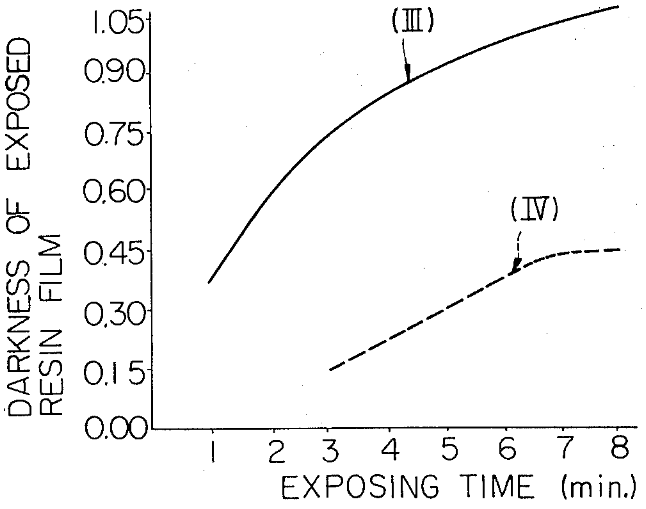

The above-stated features of the azidopyrene compounds of the present invention will be understood well from the following descriptions and the accompanying drawings, in which FIG. 1 is a graph showing spectral sensitivity of an azidopyrene compound usable for the present invention and a conventional azidocompound, and FIG. 2 is a graph showing photo-hardening property of an azidopyrene compound usable for the present invention and a conventional azidocompound.

Referring to FIG. 1, curve (I) shows the spectral sensitivity of 1-azido-6-acetylaminopyrene which is useful for the present invention and curve (II) shows that of 4,4'-diazidochalcone which is one of the conventional azide-compounds. From the graph it can be seen that 1-azido-6-acetylaminopyrene has a high photosensitivity in a large wave length region from 280 to 460 m $\mu$, and the 4,4'-diazidochalcone has that from 280 to 400 m $\mu$. Accordingly, in the region from 400 to 460 m $\mu$, the 4,4'-diazidochalcone has no spectral sensitivity whereas the 1-azido-6-acetylaminopyrene has a high spectral sensitivity. This means that the azidopyrene compounds of the present invention have a high photosensitivity to light from carbon-arc lamps and natural rays of the sun and therefore, are capable of hardening the resin by the relatively large wave length rays.

Referring to FIG. 2, curve (III) indicates photohardening property of a photosensitive composition containing azidopyrene and curve (IV) indicates that of a conventional photosensitive composition containing 4,4'-diazidochalcone.

Five parts by weight of phenol novolak resin and 2 parts by weight of 1-azidopyrene were dissolved in 93 parts by weight of ethylene glycol monoethyl ether, and the solution was uniformly applied in a thickness of 15 $\mu$ onto a surface of an aluminium plate, and then dried. In the same manner as stated above, eight photosensitive films were prepared and the respective films were exposed to a carbon-arc lamp for 1, 2, 3, 4, 5, 6, 7 and 8 minutes, separately.

The exposed films were developed with an aqueous solution containing 0.5% by weight of trisodium phosphate at a pH of 12.5 for 2 minutes, washed with water and dried. The developed resin films were subjected to the determination of darkness thereof using a photodensitometer.

The same tests as stated above were repeated using the 4,4'-diazidochalcone. The results are shown in FIG. 2. From FIG. 2, it is evident that the photosensitive composition of the present invention containing 1-azidopyrene has a photo-hardening property much higher than that of the conventional composition containing 4,4'-diazidochalcone.

Since the azidopyrene compounds have a high spectral sensitivity even in relatively large wave length region, the photosensitive composition containing the azidopyrene compound can be easily hardened, even if the carbon-arc lamp and the rays of the sun are utilized as light sources, at a high hardening rate. Accordingly, the exposure time necessary for hardening the photosensitive composition of the present invention can be shortened to from one sixth to one sixteenth that for the conventional photosensitive composition. Additionally, since the photosensitive composition of the present invention is completely hardened in a relatively short time and the hardened resin has a high rigidity, the developing operation is easy and the resultant resin images are sharp and definite.

The conventional alkali-soluble photosensitive composition containing the conventional azide compound must be developed in a narrow range of pH, 11.5 to 12.5 due to the low resistance of the hardened resin to the alkaline solution. If the pH of the developing solution is 12.5, the developing must be finished within 2 minutes at 20°C. If the pH is higher than 12.5, not only the non-exposed portions of the photosensitive film but the exposed portions thereof are eroded. That is, there is a severe limitation in the pH range in which the conventional azide compound-containing photosensitive compositions are developed without disadvantage.

The photosensitive composition of the present invention can be developed in a wide range of pH of the developing solution, 11.5 to 14.0. When the development of the photosensitive composition of the present invention is effected at a pH of 12.5, no erosion is found on the hardened portion of the composition even if the development is continued over 10 minutes.

Further, it should be noted that the hardened resin images of the photosensitive composition of the present invention have excellent resistance to acid corrosion and to abrasion.

The photosensitive composition of the present invention may contain at most 100%, preferably, 20 to 35%, based on the weight of the alkali-soluble phenolic resin, of an alkali-soluble vinyl polymer material selected from the group consisting of copolymers of acrylic acid with at least one acrylic ester, methacrylic acid with at least one acrylic ester, maleic acid anhydride with styrene and at least one maleic ester with styrene and mixtures of two or more of the above-stated copolymers.

The copolymers of acrylic acid with acrylic ester and methacrylic acid with acrylic ester preferably have a melting point of 121° to 135°C. The acrylic ester is selected from acrylic alkyl esters wherein the alkyl group has 1 – 2 carbon atoms, for example, methyl acrylate, ethyl acrylate. These copolymers are preferably composed of copolymerized acrylic acid or methacrylic acid and copolymerized acrylic ester in a mole ratio of 1 : 1.

The copolymers of maleic anhydride or maleic ester with styrene preferably have a mole ratio of 1 – 2 : 1 of the copolymerized maleic anhydride or maleic ester to the copolymerized styrene. The maleic ester may be selected from maleic alkyl ester wherein the alkyl group has 1 – 2 carbon atoms, for example, monomethyl maleate, dimethyl maleate, monoethyl maleate and diethyl maleate.

The alkali-soluble vinyl polymer material available for the present invention are linear polymeric materials having highly polar carboxyl groups which are effective for enhancing the rigidity, hardness, bonding property to metal surface and resistances to abrasion and corrosion by acid solution, of the hardened photosensitive composition.

Such enhanced properties of the hardened photosensitive composition create advantages of easy operation and control of the productions of various printing plates (offset, photo-relief, presensitized, and rotary photogravure plates), printed circuit boards and shadow mask of color Braun tube, wherein metallic materials are chemically etched.

The photosensitive composition of the present invention may contain small amounts of one or more additives, for example, coloring material, antistatic agent, polymerization accelerator, chain transfer agent, inhibitor and retarder.

The photosensitive composition of the present invention may be applied onto a surface of a substrate material in the manner detailed below.

The photosensitive composition is dissolved in an organic solvent selected from organic liquids which substantially do not obstruct hardening of the photosensitive composition during exposure to light. For example, the organic solvent may be diethylene glycol monomethyl ether, diethylene glycol monoethyl ether, diethylene glycol dimethyl ether, diethylene glycol diethylether, ethylene glycol diethyl ether, ethylene glycol monobutyl ether, ethylene glycol ethyl ether acetate, ethylene glycol butyl ether acetate, n-butyl butyric acid, alcohols, for example, methyl ethyl, propyl, butyl, amyl, hexyl, heptyl, octyl, nonyl, cyclohexyl, benzyl, and furfuryl alcohols, and a mixture of two or more compounds mentioned above. The solution is applied in a desired thickness, onto a surface of a desired substrate material, for example, of photo-resist, photo-relief, offset printing plate, presensitized plate, relief printing plate, printed circuit board, name plate, shadow mask of color Braun tube, etc., by conventional application methods, such as spraying, brush coating, roll coating, doctor coating, dipping, and then, the solution is dried. A photosensitive composition film is formed on the substrate surface. The photosensitive composition film is exposed in accordance with a predetermined pattern, to the rays from the sun, and the conventional artificial light sources, for example, carbon-arc lamp, mercury-arc lamp, and xenon lamp. During the exposure, the exposed portions of the photosensitive composition film are hardened and insolubilized to alkaline aqueous solution. Thereafter, the photosensitive composition film is subjected to development with an alkaline aqueous solution to remove the non-exposed portions thereof. The developing solution contains an alkali metal compound selected from sodium hydroxide, potassium hydroxide, sodium carbonate, sodium silicate, sodium metasilicate, trisodium phosphate and is adjusted to a pH of 11.5 to 14.0. The developing is usually effected at a temperature of 20° – 35°C. for 1 – 3 minutes.

The resin images thus formed on the substrate material surface have a high rigidity, hardness, and ink-receptivity (oleophilic property) and an excellent resistance to abrasion and acid corrosion.

The present invention will be further illustrated by the following examples which are given by way of illustration and not as limitations to the scope of the present invention.

EXAMPLE 1

Preparation of 1-azidopyrene

A solution was prepared by dissolving 25 g of pyrene in 250 ml of gracial acetic acid. To the solution was added a mixed acid of 15 ml of nitric acid having a specific gravity of 1.4 with 30 ml of glacial acetic acid. The reaction mixture was agitated at a temperature of 50°C for an hour and, thereafter, cooled to precipitate the resulting crystals. The resultant 1-nitropyrene crystals were isolated by way of filtration. The yield of the 1-nitropyrene was 94%. 20 g of the 1-nitropyrene was dispersed in ethyl alcohol and reduced with hydrogen gas in the presence of palladium carbon catalyst, to convert it to 1-aminopyrene (m.p. 116°C). In accordance with the conventional procedures, the 1-aminopyrene was diazotized with sodium nitrite and hydrochloric acid and thereafter, the diazo compound was treated with sodium azide to convert it to 1-azidopyrene. The 1-azidopyrene thus prepared has a decomposition point of 117° to 118°C. and a spectral sensitivity in a wave length region from 280 to 420 m $\mu$.

EXAMPLE 2

Preparation of 6-nitro-1-azidopyrene

In accordance with the same procedures as those in Example 1, 25 g of 1-aminopyrene were prepared. The 1-aminopyrene was dissolved in 200 ml of glacial acetic acid, and then 15 ml of acetic anhydride were added to the solution. The reaction solution thus prepared was boiled for an hour and, thereafter, poured into cold water to crystallize the resultant 1-acetylaminopyrene. The crystalline 1-acetylaminopyrene was filtered and dried. The 1-acetylaminopyrene having a melting point 255° to 257°C was obtained in an yield of 99.6%. 31 g of 1-acetylaminopyrene were dissolved in 300 ml of glacial acetic acid. To the solution was added a mixed acid of 9 g of nitric acid having a specific gravity of 1.5 and 40 ml of glacial acetic acid, and the reaction solution was heated at a temperature of 85°C for an hour. The reaction solution was cooled to crystallize the reaction product, and the crystals were isolated by filtering and dried. 6-nitro-1-acetylaminopyrene having a melting point of 230° to 233°C was obtained at an yield of 72%. The 6-nitro-1-acetylaminopyrene was treated with a diluted hydrochloric acid solution for several hours while refluxing. 6-nitro-1-aminopyrene having a melting point of 205° to 209°C was obtained at an yield of 88%.

In accordance with the conventional procedures, the 6-nitro-1-aminopyrene was diazotized with sodium nitrite and hydrochloric acid and then the diazotized compound was treated with sodium azide to convert it to 6-nitro-1-azidopyrene having a decomposition point of 151°C and a spectral sensitivity in a wave length region from 290 to 555 m $\mu$. The yield was 82%.

EXAMPLE 3

Preparation of 1,6-diazidopyrene

To produce 6-nitro-1-aminopyrene, the same procedures as in Example 2 were repeated. 15.4 g of 6-nitro-1-aminopyrene was suspended in cyclohexane and reduced with hydrogen gas in the presence of palladium carbon catalyst. 1,6-diaminopyrene was obtained in an yield of 95%. In the same procedures as in Example 1, the 1,6-diaminopyrene was diazotized and then converted to 1,6-diazidopyrene at an yield of 75%. The resultant 1,6-diazidopyrene had a spectral sensitivity in a wave length region from 260 to 420 m$\mu$.

EXAMPLE 4

Preparation of 1-propionyl-6-azidopyrene

In a flask of 1*l* provided with a stirrer, thermometer and dropping funnel, 51.6 g of 1-propionylpyrene were dissolved in 250 ml of acetic anhydride at an elevated temperature, and the solution was gradually cooled. To the cooled solution, 22.8 g of nitric acid having a specific gravity of 1.38 were added dropwise at 20°C. By the reaction of the 1-propionylpyrene with the nitric acid, yellow precipitates were produced. 500 of water were added to the reaction mixture to completely hydrolyze the acetic anhydride, and then, the precipitates were isolated by means of filter. Yellow crude 1-propionyl-6-nitropyrene was obtained in an amount of 58 g (yield: 95%). This had a melting point of 138° to 144°C. The crude product was recrystallized from glacial acetic acid. Pure yellow-1-propionyl-6-nitropyrene having a melting point of 143° to 145°C was obtained at an yield of 82.5%.

30 g of the 1-propionyl-6-nitropyrene were dispersed in 600 ml of ethyl alcohol, and reduced by adding 6 g of 5% palladium carbon as a catalyst while stirring, and dropping 50 g of hydrazine hydrate while refluxing.

The 1-propionyl-6-nitropyrene dissolved in ethyl alcohol with the progressing of the reaction and a uniform solution was formed. After the reaction progressed for 2 hours, the reaction solution was filtered to remove the palladium carbon catalyst and concentrated to recover the ethyl alcohol. To the concentrated filtrate was added water to precipitate 1-propionyl-6-aminopyrene. The 1-propionyl-6-aminopyrene having a melting point of 48° to 55°C was obtained in an amount of 24.5 g (yield: 89%). The 1-propionyl-6-aminopyrene thus prepared was dissolved in a solution of 84 g of concentrated hydrochloric acid in 600 ml of water, and the solution was cooled. To diazotize the amino compound, 12 g of sodium nitrite was added to the cooled solution at a temperature of 0° to 3°C. The reaction solution was filtered to remove precipitates, and cooled by adding lumps of ice. 11.6 g of sodium azide was added to the cooled solution while agitating it. The diazo compound in the cooled solution was rapidly converted to a yellow brown azide compound. After continuing the reaction until coupling tests results in no coloring, the reaction product was separated by way of filtering, and washed with water. A crude 1-propionyl-6-azidopyrene in an amount of 16.5 g was obtained at an yield of 58%. This had a melting point of 85° to 93°C. The crude compound was purified by recrystallization from toluene. The purified 1-propionyl-6-azidopyrene had a melting point of 95° to 98°C and a spectral sensitivity in a wave length region from 320 to 470 m $\mu$.

EXAMPLE 5

Preparation of 1-acetyl-6-azidopyrene

In accordance with the same procedures in Example 4, 1-acetyl-6-nitropyrene was prepared using 1-acetyl-pyrene instead of the 1-propionylpyrene and glacial acetic acid in place of the acetic anhydrate.

A four-neck flask of 2 liters provided with a condenser, dropping funnel, stirrer and thermometer was charged 73 g of 1-acetyl-6-nitropyrene, 500 ml of ethyl alcohol and 7 g of 5% palladium carbon catalyst, and heated in a water bath to raise the temperature of the reaction mixture to 71°C. 171 g of hydrazine hydrate were added dropwise to the reaction mixture and heated at 71°C for 4 hours while refluxing. The reaction mixture was filtered to remove the catalyst and the filtrate was concentrated and then mixed with water, 63 g of 1-acetyl-6-aminopyrene were obtained at an yield of 96%.

26 g of 1-acetyl-6-aminopyrene were dissolved in a solution of 60 g of hydrochloric acid in 300 ml of water. After cooling the solution, an aqueous solution containing 14 g of sodium nitrite was dropped into the cold solution. After the reaction progressed for 3 hours, the remaining nitrous acid was decomposed by adding sulfamic acid into the solution. The solution was filtered to separate a brownish yellow solution of the resultant diazo compound.

When an aqueous solution containing 13.4 g of sodium azide was dropped into the diazo compound solution, an azide compound was immediately separated from the solution as yellow precipitates. The precipitates were isolated by way of filtering, washed with water and then dried. The 1-acetyl-6-azidopyrene thus prepared had a melting point of 125 to 130°C and a spectral sensitivity in a wave length region from 310 to 470 m $\mu$.

EXAMPLE 6

Preparation of 1-n-butylyl-6-azidopyrene 1-butylyl-6-nitropyrene was prepared from 1-n-butylylpyrene by the same procedures as in Example 4, and then, converted to 1-n-butylyl-6-aminopyrene in the same manner as in Example 5. 25 g of 1-n-butylyl-6-aminopyrene were dispersed in 300 ml of water charged into a 1 litre beaker. To the aqueous dispersion were added 100 g of concentrated hydrochloric acid. An aqueous solution containing 7 g of sodium nitrite was added dropwise to the dispersion while stirring and cooling it at 0° to 2°C. After the reaction progressed for 2 hours, the remaining nitrous acid was decomposed by adding sulfamic acid. The reaction mixture was filtered. An yellow orange aqueous solution of a diazo compound was obtained. The solution was cooled by adding ice, and an aqueous solution containing 6.8 g of sodium azide was added to the solution while stirring it. This immediately resulted in precipitation of a yellow azide compound. The azide compound was separated by means of filter and washed with water and dried. 22 g of a crude 1-n-butylyl-6-azidopyrene having a melting point of 70° to 80°C were obtained in an yield of 80%. The crude azide compound was recrystallized from acetone. 9.5 g of brownish yellow crystals of purified 1-n-butylyl-6-azidopyrene were obtained. The pure azidopyrene compound had a melting point of 98° to 100° C and a spectral sensitivity in a wave length region from 300 to 480 m $\mu$.

EXAMPLE 7

Preparation of propionyl-bromo-azidopyrene

Propionyl-bromo-nitropyrene was prepared from propionyl-bromopyrene by the same process as in Example 4, and then, converted to propionyl bromoaminopyrene by reducing it in ethyl alcohol with hydrazine in the presence of palladium carbon catalyst. In accordance with the same process as in Example 6, 35 g of the propionyl bromo-aminopyrene was diazotized and then converted to 27 g of propionyl bromoazidopyrene (m.p. 93° to 106°C) in the form of yellow powder. The yield was 72%. The propionyl bromoazidopyrene had a spectral sensitivity in a wave length region from 310 to 490 m $\mu$.

EXAMPLE 8

Preparation of propionyl azidopyrene sulfonic acid

Propionyl nitropyrene was prepared by the same process as in Example 4. 30 g of the propionyl nitropyrene were dissolved in 500 ml of carbon tetrachloride. To the solution were added dropwise 17 g of chlorosulfonic acid of a temperature of 0° to 5°C while cooling it at 0° to 5°C and stirring. After the reaction for 3 hours, the reaction solution was distilled to eliminate the carbon tetrachloride. The residue of the distillation was dissolved in 1000 ml of water, the solution was filtered, and the filtrate was salted out. 28 g of a yellow sodium salt of propionyl nitropyrene sulfonic acid thus prepared were converted to 30 g of a sodium salt of propionyl aminopyrene sulfonic acid by reducing it with hydrazine in the presence of palladium carbon catalyst in accordance with the same method in Example 4. The yield was 80%. 30 g of the sodium salt of propionyl aminopyrene sulfonic acid were dispersed in an aqueous solution of 50 g of concentrated hydrochloric acid in 300 ml of water. To the dispersion was added an aqueous solution containing 7 g of sodium nitrite at a temperature of 0° to 5°C to diazotize it. After completing the reaction, the reaction mixture was filtered to remove insoluble substances. The diazo compound in the filtrate was converted to a yellow azide compound by adding 9 g of sodium azide. The azide compound was salted out, separated by filtering, washed with an aqueous solution of common salt and dried. 16 g of a yellow sodium salt of propionyl azidopyrene were obtained. The yield was 40%. The azide compound thus prepared has a spectral sensitivity in a wave length region from 320 to 480 m $\mu$.

EXAMPLE 9

Preparation of propionyl diazidopyrene 26 g of propionyl pyrene were converted to propionyl dinitropyrene by heat-dissolving them in 150 ml of acetic acid anhydride and dropping 12 g of nitric acid having a specific gravity of 1.38 into the solution at 60°C, and then, further converted to 29 g of propionyl diaminopyrene in accordance with the same method of Example 4.

The propionyl diaminopyrene thus prepared were dispersed in 300 ml of water charged in a 1 litre beaker. The disperson was mixed, while stirring, with 100 g of concentrated hydrochloric acid, the mixture was cooled with ice, and an aqueous solution containing 14 g of sodium nitrite was dropped into the mixture at 0° to 2°C. After the reaction progressed for 3 hours, the remaining nitrous acid was decomposed with sulfamic acid. The reaction mixture was filtered to obtain a yellow aqueous solution of diazo compound.

The solution was cooled to a temperature of 0° to 5°C by adding ice while stirring it. When an aqueous solution of 13 g of sodium azide was added to the cold solution of the diazo compound, yellow precipitates were immediately separated from the solution. The reaction was allowed to continue until coupling tests resulted in no coloring. The reaction product was separated by filtering, washed with water and dried. 20 g of yellow powder consisting of propionyl diazidopyrene (m.p.: 98° to 114°C) were obtained. The yield was 60%. The diazide compound thus prepared had a spectral sensitivity in a wave length region from 280 to 440 m $\mu$.

EXAMPLE 10

A photosensitive composition was prepared from 2 parts by weight of 1-azidopyrene and 5 parts by weight of alkali-soluble phenol novolak resin and dissolved in 93 parts by weight of ethylene glycol monoethyl ether. The solution of the photosensitive composition was applied, in a thickness of 15 to 20 $\mu$, onto a surface of an aluminium plate usable as an offset printing plate material, using a whirler, and dried. The film of the photosensitive composition formed on the aluminium plate surface was masked in accordance with a predetermined pattern, and exposed for 80 seconds to rays from a 1 KW Xenon lamp which was separated from the film a distance of 100 cm. By the exposure, the non-masked portions of the photosensitive composition film were hardened, but the masked portions were not hardened.

The photosensitive composition film thus exposed was treated with a developing liquid consisting of 1 part of trisodium phosphate, 0.1 parts of an anionic surface active agent and 99 parts of water, to dissolve away the non-hardened portions of the film. The resin images thus formed were sharp and clear, firmly fixed to the aluminium plate surface and had a high affinity to the conventional printing ink. The aluminium printing plate carrying thereon the resin images was excellent as an offset printing plate.

EXAMPLE 11

The same procedures as in Example 10 was repeated using a zinc plate instead of the aluminium plate. The resin images were firmly fixed onto the zinc plate surface and excellent for the offset printing plate.

EXAMPLE 12

A photosensitive composition consisting of 1 part by weight of 8-nitro-1-azidopyrene, 4 parts by weight of alkalisoluble phenol novolak resin and 0.005 parts by weight of C.I. Solvent Green 15, was dissolved in 95 by weight of ethylene glycol monoethyl ether. The solution was applied, in a thickness of 20 to 25 $\mu$, onto a surface of a magnesium plate usable as a photo-relief printing plate material, and dried. Thus, presensitized magnesium plate was obtained.

A negative film having a predetermined pattern was superimposed on the presensitized magnesium plate and they were firmly fixed to each other under a vacuum condition. An exposure was effected on the negative film for 40 seconds using a 2KW super high voltage mercury-arc lamp positioned at a distance of 100 cm from the negative film surface.

After removing the negative film, the photosensitive film was developed with an alkaline aqueous solution containing 5% by weight of sodium metasilicate and 0.1% by weight of a non-ionic surface active agent at 25°C using an automatic developing machine. In the developing, the alkaline aqueous solution was sprayed onto the photosensitive film and the non-exposed portions of the film were dissolved away. The development was completed in about 1 minute. The magnesium plate provided with the resin images thereon was washed with water and immediately subjected, without drying, to etching with a conventional etching solution to form a photo-relief printing plate.

Preferably, in order to enhance easiness of the developing operation, a coloring material is added into the photosensitive composition. The addition of the coloring material is generally in an amount of 0.1 to 1.0% based on the sum of the weight of the solid contents in the photosensitive composition. The coloring material may be selected from the triphenyl methane type solvent soluble blue, violet and green dyes such as C.I. Solvent Violets 8, 9 and 27, C.I. Solvent Blues 2 through 6, 23, 43, 54, 66, 71, 72, 73 and 81 and C.I. Solvent Greens 1, 2 and 15 which are effective for easily recognizing, by the naked eye, the development of images under illumination by yellow safe light in a dark developing chamber.

EXAMPLE 13

Aa photosensitive composition consisting of 2 parts by weight of 1,6-diazidopyrene, 10 parts by weight of alkalisoluble m-cresol modified phenol novolak resin, 10 parts by weight of a copolymer of 50% by mole of acrylic acid and 50% by mole of methyl acrylate and 0.11 parts by weight of C.I. Solvent Violet 8 was dissolved in 39 parts by weight of ethylene glycol monoethyl ether and 39 parts by weight of ethylene glycol monoethyl ether and 39 parts by weight of ethylene glycol monoethyl ether monoacetate. The solution was applied, in a thickness of 20 to 25 $\mu$, onto a base plate for a printed circuit board, which plate was composed of a phenol-formaldehyde resin plate and a copper foil having a thicknes of 0.3 mm and adhered to the phenolic resin plate. The applied photosensitive composition solution was dried to form a photosensitive film on the copper foil surface. The photosensitive film was masked, exposed, developed, washed with water and then dried by the same procedures as in Example 10. The base plate provided thereon with the resin images was subjected to etching by an aqueous solution of ferric chloride and then, the resin images were peeled off by immersing them in a aqueous solution of 50% ethyl alcohol. A printed circuit board was obtained.

EXAMPLE 14

A photosensitive composition was prepared from 2 parts by weight of 1-azido-6-metoxypyrene, 6 parts by weight of an alkali-soluble phenol novolak resin, 2 parts by weight of a copolymer of 50% by mole of styrene and 50% by mole of maleic anhydride and 0.01 parts by weight of C.I. Solvent Blue 43. The composition was dissolved in 60 parts by weight of ethylene glycol monoethyl ether monoacetate and 40 parts by weight of methylethyl ketone.

A zinc plate for photo-relief, having a thickness of 0.83 mm was ground using a rotating wire brush and Pumicestone to form a rough surface thereof, treated with 5% acetic acid aqueous solution, washed and then dried. The rough surface zinc plate was set up on a whirler and rotated at a velocity of 75 r.p.m. The photosensitive composition solution prepared above was applied onto the rotating rough surface of the zinc plate and dried in a drier. After evaporating the solvent, a photosensitive film of a thickness of 25 $\mu$ was formed on the rough surface of the zinc plate. A negative film having a predetermined network pattern was superimposed on the photosensitive film on the zinc plate, and exposed for 120 seconds to radiation rays from a 2KW mercury-arc lamp spaced by 100 cm from the negative film. The exposed photosensitive film was developed with an alkaline aqueous solution consisting of 3 parts by weight of sodium metasilicate, 97 parts by weight of water and 0.1 parts by weight of an anionic surface active agent.

After developing, the exposed portions of the photosensitive film were completely hardened and firmly fixed to the zinc plate surface. Therefore, the hardened resin had a high resistance to acids and a high rigidity, and thus, was pertinent as a resist. The zinc plate providing thereon the resin images were washed with water and then subjected, without drying, to etching by a 10% nitric acid aqueous solution, using an automatic etching machine.

EXAMPLE 15

An aluminium plate was ball-grained using a aluminous abrasive grain of 600 mesh, treated with a 1% sodium hydroxide aqueous solution and then with a 5% acetic acid aqueous solution, washed with water and dried while protecting the washed surface from dusts.

A photosensitive composition consisting of 3 parts by weight of 1-azidopyrene-6-carboxylic acid, 10 parts by weight of a phenol novolak resin, 3 parts by weight of a copolymer of 50% by mole of acrylic acid with 50% by mole of methyl acrylate, and 0.056 parts by weight of C.I. Solvent Blue 5, was dissolved in a solvent consisting of 40 parts by weight of dimethylcarbitol, 20 parts by weight of cyclohexanone and 24 parts by weight of ethylene glycol monoethyl ether monoacetate.

The solution was applied, in a thickness of 25 $\mu$, onto the grained surface of the aluminium plate using a roll coater and dried. The aluminium plate providing thereon the photosensitive film was charged in a vacuum exposing device, covered by a negative film having a predetermined network pattern and exposed for 120 seconds by means of a 2KW super high voltage mercury-arc lamp spaced by 100 cm from the negative film. The exposed photosensitive film of the plate was developed by an alkaline solution consisting of 2 parts by weight of trisodium phosphate, 1 part by weight of sodium hydroxide, 0.1 parts by weight of an anionic surface active agent and 97 parts by weight of water. The non-exposed non-hardened portions of the photosensitive film were dissolved away. The developed resin images on the aluminium plate involved definite 175 lines per inch of the network. Such fine images were firmly fixed on the plate surface. The aluminium plate providing thereon the resin images were used as a printing plate for offset printing. More than 10,000 pieces of coated paper were printed by a single printing plate using a conventional printing ink.

EXAMPLE 16

The same procedure as in Example 14 were repeated using a solution of a photosensitive composition consisting of 2 parts by weight of 1-acetyl-6-azidopyrene, 8 parts by weight of a phenol novolak resin and 0.4 parts by weight of C.I. Solvent Blue 5 in a solvent consisting of 40 parts by weight of ethylene glycol monoethyl ether and 60 parts by weight of methylethyl ketone. The photosensitive film was exposed for 90 seconds using a 30 W carbon arc lamp spaced by 50 cm from the negative film. The resultant resin images had a high rigidity, adhering strength, ink-receptivity and resistance to abrasion.

EXAMPLE 17

The same procedures as in Example 15 were repeated using a solution of the following composition:

| | | |
|---|---|---|
| 1-Acetyl-6-azidopyrene | 5 | parts by weight |
| Phenol novolak resin | 20 | |
| Ethylene glycol monoethyl ether acetate | 40 | |
| Cyclohexanone | 30 | |
| Dimethylcarbitol | 20 | |
| n-Butyl acetate | 10 | |

The exposing was effected for 90 seconds, and the exposed photosensitive film was developed by a 4% sodium metasilicate aqueous solution. The resultant offset printing plate could print more than 10,000 pieces of coated paper without defect. The photosensitive film prepared above could be stored over 3 months without change in photosensitivity and developing property thereof.

EXAMPLE 18

The same procedures as in Example 13 were repeated using a solution of the following composition:

| | | |
|---|---|---|
| 1-n-butylyl-6-azidopyrene | 2 | parts by weight |
| m-cresol modified phenol novolak resin | 6 | |
| Ethylene glycol monoethyl ether | 40 | |
| Ethylene glycol monoethyl ether acetate | 40 | |
| n-butyl acetate | 20 | |

A printed circuit board having an exact pattern was obtained.

EXAMPLE 19

The same procedures as in Example 10 were repeated using 3 parts by weight of 1-azido-6-acetylaminopyrene instead of 2 parts by weight of 1-azidopyrene. The resultant resin images had sufficient ink-receptivity and were useful for offset printing.

EXAMPLE 20

The same procedures as in Example 14 were repeated using 2.4 parts by weight of 1-azido-6-bromopyrene in place of 2 parts by weight of 1-azido-6-methoxypyrene.

The resulting resin images had an excellent resistance to acid corrosion. The zinc plate was etched in accordance with the pattern of the resin images formed thereon, with a 10% nitric acid aqueous solution.

EXAMPLE 21

The same procedures as in Example 13 were repeated using 3 parts by weight of 1-azido-6-ethylaminopyrene instead of 2 parts by weight of 1,6-di-azidopyrene. The copper foil surface of the base plate was ground using a rotary wire brush and cleaned with trichloroethylene. The solution of the photosensitive composition was sprayed onto the copper foil surface using a spray gun. The exposure was effected for 120 seconds using a 30 A carbon-arc lamp at a distance of 80 cm from the photosensitive composition film.

The resultant resin images had an excellent resistance to acid corrosion. The copper foil was accurately etched in accordance with the pattern of the resin images formed thereon, by spraying a 42° Be' aqueous solution of ferric chloride, at 20°C, onto the copper foil surface. During spraying, the resin images were firmly maintained on the copper foil surface.

What we claim is:

1. A photosensitive composition capable of being photohardened and insolubilized in alkaline aqueous solutions upon photographic exposure, said composition comprising an alkalisoluble phenolic resin and 5 to 30%, based on the weight of said phenolic resin, of at least one photosensitive compound selected from the group consisting of monoazidopyrene compounds of the formula (I) and diazidopyrene compounds of the formula (II):

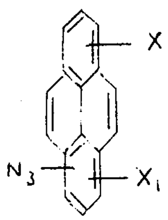

(I) and

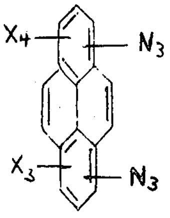

(II)

wherein $X_1$, $X_2$, $X_3$ and $X_4$ each represents a hydrogen or halogen atom or nitro, monoalkylamino, acylalkylamino, dialkylamino, tosylamino, alkoxyl, hydroxyl, acyl, carboxyl, carboxymethyl or sulfonic acid radical.

2. A photosensitive composition as claimed in claim 1, wherein said photosensitive compound is in an amount of 10 to 25% based on the weight of said phenolic resin.

3. A photosensitive composition as claimed in claim 1, wherein said halogen atom is selected from chlorine or bromine atom.

4. A photosensitive composition as claimed in claim 1, wherein said monoalkylamino radical has an alkyl group having 1 to 4 carbon atoms.

5. A photosensitive composition as claimed in claim 1, wherein said acylalkylamino radical has an acyl group having 2 to 7 carbon atoms and an alkyl group having 1 to 4 carbon atoms.

6. A photosensitive composition as claimed in claim 1, wherein said dialkylamino radical has the same or different two alkyl groups each having 1 to 4 carbon atoms.

7. A photosensitive composition as claimed in claim 1, wherein said alkoxyl group has 1 to 4 carbon atoms.

8. A photosensitive composition as claimed in claim 1, wherein said acyl radical has 2 to 7 carbon atoms.

9. A photosensitive composition as claimed in claim 1, wherein said photosensitive monoazide compound is selected from the group consisting of 1-azidopyrene, 6-nitro-1-azidopyrene, 1-azido-6-acetylaminopyrene, 1-azido-8-acetylaminopyrene, 1-azido-6-chloropyrene, 1-azido-6-bromopyrene, 1-azido3,8-dihydroxypyrene, 1-azido-6-methoxypyrene, 1-azido-6-N-benzoylaminopyrene, 1-azido-6-N-benzoylaminopyrene, 1-azido6-N-ethylaminopyrene, 1-azidopyrene-3,8-disulfonic acid, 1-azidopyrene-6-carboxylic acid, 1-azido-6-N,N-dimethylaminopyrene, 1-azido-6-p -tosylaminopyrene, 1-azido-6- carboxymethylpyrene, 1-acetyl-6-azidopyrene, 1-propionyl-6-azidopyrene 1-n-butyrlyl-6-azidopyrene, 1-isobutylyl-6-azidopyrene, 1-n-valeryl-6-azidopyrene, 1-isovaleryl-6-azidopyrene, 1-sec.valeryl-6-azidopyrene, acetylazidopyrene sulfonic acid, acetylchloroazidopyrene, acetylbromoazidopyrene, acetylmethylazidopyrene, acetylmethoxyazidopyrene, acetylphenoxyazidopyrene, acetylnitroazidopyrene, acetylaminoazidopyrene, acetyl-N-methylaminoazidopyrene, acetyl-N,N-dimethylazidopyrene, acetylazidopyrene carboxylic acid, propionylazidopyrene sulfonic acid, propionylazidopyrene carboxylic acid, and ethyl ester of propionylazidopyrene carboxylic acid.

10. A photosensitive composition as claimed in claim 1, wherein said photosensitive diazide compound is 1,6-diazidopyrene, acetyl-diazidopyrene and propionyl-diazidopyrene.

11. A photosensitive composition as clamined in claim 1, wherein said phenolic resin is selected from the group consisting of alkali-soluble phenol novolak resins, modified phenol novolak resins and mixtures of two or more of the abovementioned resins.

12. A photosensitive composition as claimed in claim 11, wherein said phenol novolak resin is a condensation product of phenol with formaldehyde in a mole ratio of 1 : 0.7 to 0.9.

13. A photosensitive composition as clained in claim 11, wherein said modified phenol novolak resin is selected from the group consisting of m-cresol, p-cresol, p-tert.-butylphenol and cashew nut shell oil modified phenol novolak resins.

14. A photosensitive composition as claimed in claim 11, wherein said modified phenol novolak resin has a melting point of 108° to 113°C.

15. A photosensitive composition as claimed in claim 1, further comprising at most 100%, based on the weight of said phenolic resin, of an alkali-soluble vinyl polymer material selected from the group consisting of copolymers of acrylic acid with at least one acrylic ester, methacrylic acid with at least one acrylic ester, maleic anhydride with styrene, and at least one maleic ester with styrene, and mixtures of two or more of the above-mentioned copolymers.

16. A photosensitive composition as claimed in claim 15, wherein said copolymers of acrylic acid with acrylic ester are composed of copolymerized acrylic acid and acrylic ester in a ratio of 1 : 1 by mole.

17. A photosensitive composition as claimed in claim 15, wherein said copolymers of methacrylic acid with acrylic ester are compound of copolymerized methacrylic acid and acrylic ester in a ratio of 1 : 1 by mole.

18. A photosensitive composition as clained in claim 15, wherein said copolymers of acrylic acid with acrylic ester and methacrylic acid with acrylic ester have a melting point of 121° to 135°C.

19. A photosensitive composition as claimed in claim 15, wherein said copolymers of maleic anhydride with styrene are composed of copolymerized maleic anhydride and styrene in a ratio of 1 – 2 : 1 by mole.

20. A photosensitive composition as claimed in claim 15, wherein said copolymers of maleic esters with styrene are composed of copolymerized maleic esters and styrene in a ratio of 1 – 2 : 1 by mole.

21. A photosensitive composition as claimed in claim 15, wherein said alkali-soluble vinyl polymer is in an amount of 20 to 35% based on the weight of said phenolic resin.

22. A photosensitive composition as claimed in claim 15, wherein said acrylic ester has an alkyl group of 1 to 2 carbon atoms.

23. A photosensitive composition as claimed in claim 15, wherein said maleic ester has one or two alkyl group of 1 to 2 carbon atoms.

* * * * *

UNITED STATES PATENT OFFICE
CERTIFICATE OF CORRECTION

Patent No. 3,923,522 Dated December 2, 1975

Inventor(s) Yukinori Hata, Hidetoshi Komiya & Yuzuru Osabe

It is certified that error appears in the above-identified patent and that said Letters Patent are hereby corrected as shown below:

Column 8, line 20, after "500" insert --ml--

Column 9, line 37, "1-butylyl-6-nitropyrene" should be -- 1-n-butylyl-6-nitropyrene --

Column 11, line 57, after "exposure" insert --operation--

Signed and Sealed this

*twenty-third* Day of *March 1976*

[SEAL]

*Attest:*

RUTH C. MASON
*Attesting Officer*

C. MARSHALL DANN
*Commissioner of Patents and Trademarks*